United States Patent [19]

Zavracky et al.

[11] Patent Number: 5,074,952
[45] Date of Patent: Dec. 24, 1991

[54] ZONE-MELT RECRYSTALLIZATION METHOD AND APPARATUS

[75] Inventors: Paul M. Zavracky, Norwood; Jack P. Salerno, Waban; Matthew M. Zavracky, N. Attleboro, all of Mass.

[73] Assignee: Kopin Corporation, Taunton, Mass.

[21] Appl. No.: 372,098

[22] Filed: Jun. 28, 1989

Related U.S. Application Data

[63] Continuation of Ser. No. 120,022, Nov. 13, 1987, abandoned.

[51] Int. Cl.$^5$ .................. C30B 13/30; C30B 13/32
[52] U.S. Cl. .................. 156/601; 156/620.71; 156/620.7; 156/620.76; 156/DIG. 64; 422/245; 422/248; 422/109
[58] Field of Search .......... 156/601, 620.71, 620.7, 156/620.76, DIG. 64; 422/245, 248, 109; 373/139

[56] References Cited

U.S. PATENT DOCUMENTS

| | | | |
|---|---|---|---|
| 2,719,799 | 10/1955 | Christian | 373/139 |
| 2,852,351 | 9/1958 | Pfann | 422/245 |
| 3,198,929 | 8/1965 | Stut | 373/139 |
| 3,433,627 | 3/1969 | Liang et al. | 75/65 |
| 3,546,027 | 12/1970 | Harle et al. | 156/620.7 |
| 3,984,280 | 9/1976 | Besselere et al. | 156/620.7 |
| 4,068,814 | 1/1978 | Anthony et al. | 156/605 |
| 4,086,424 | 4/1978 | Mellen, Sr. | 156/620.7 |
| 4,135,027 | 1/1979 | Anthony et al. | 156/620.71 |
| 4,196,042 | 4/1980 | Reynolds | 156/620.7 |
| 4,371,421 | 2/1983 | Fan et al. | 156/624 |
| 4,479,846 | 10/1984 | Smith et al. | 156/603 |
| 4,578,143 | 3/1986 | Arai | 156/620.71 |
| 4,694,143 | 9/1987 | Nishimura et al. | 118/725 |

FOREIGN PATENT DOCUMENTS

| | | | |
|---|---|---|---|
| 2583572 | 7/1986 | France | 156/600 |
| WO82/03639 | 10/1982 | PCT Int'l Appl. | 156/624 |

OTHER PUBLICATIONS

"Zone Melting Recrystallization of Silicon Film wth a Moveable Strip Heater Oven" by Geis et al., *J. Electrochem. Soc. Solid State Science and Technology*, vol. 129, p. 2813, 1982.

*Laser and Electron-Beam Interactions with Solids*, "Transient Heating with Graphite Heaters for Semiconductor Processing", by Fan et al., 1982, pp. 751-758.

*Primary Examiner*—Olik Chaudhuri
*Assistant Examiner*—Robert M. Kunemund
*Attorney, Agent, or Firm*—Hamilton, Brook, Smith & Reynolds

[57] ABSTRACT

The improved zone-melt recrystallization apparatus is comprised of a heating element having a plurality of individually controllable heating elements. The elements are heated in sequence to generate a melted zone within a semiconductor material which is translated across the material by heating then cooling adjacent heating elements to recrystallize the material.

19 Claims, 1 Drawing Sheet

ZONE-MELT RECRYSTALLIZATION METHOD AND APPARATUS

This is a continuation of co-pending application Ser. No. 07/120,022 filed on Nov. 13, 1987, now abandoned.

BACKGROUND

This invention relates generally to the conversion of amorphous or polycrystalline semiconductor materials to substantially single crystal semiconductor material by a process known as zone-melting-recrystallization (ZMR).

The development of silicon-on-insulator (SOI) technology has been complemented by the use of ZMR processing to produce single crystal silicon for solid state devices exhibiting reduced parasitic capacitance, simplified device isolation and design, and radiation hard circuits for space applications.

Present ZMR processes require a well controlled mechanical system to translate a hot zone created by a moving strip heater across the surface of a heated silicon wafer. This system is elaborate, expensive, and has a number of mechanical parts that could degrade in time. U.S. Pat. No. 4,371,421 entitled "Lateral Epitaxial Growth by Seeded Solidification" describes such a system.

A sample to be recrystallized is placed on a heater which raises the temperature of the sample close to its melting point. A strip heater positioned above the sample is then energized to induce melting of a zone on the sample directly beneath the strip heater element. The strip heater is then translated past the surface of the sample, causing the melting zone to move in unison with the heater to induce melting then solidification of the sample to achieve lateral epitaxial growth thereby transforming the sample into a single crystal material.

SUMMARY OF THE INVENTION

The present invention comprises a new heating system that accomplished the same task with no moving parts. A moving heat zone is electrically provided using a heater block fabricated from Alumina, Zirconia, or some other refractory material in such a way as to support a large number of small heating elements. In order to keep these heating elements separated during the process and prevent them from shorting out, they are placed in small grooves machined into the refractory block. Each of these wire elements is supplied with electrical current through a control circuit. With such a circuit, it is possible to provide any combination of heated elements at any desired temperature. When sufficient current is provided to a heating element, it will become hot due to its resistivity. The refractory block is machined in such a way as to provide support of a silicon wafer. The wafer is centered over the hot zone. The heating element lengths could be adjusted so that they do not extend beyond the edges of the wafer. This provides a significant advantage to current ZMR processes by limiting edge heating.

The above, and other features of the invention, including various novel details of construction and combination of parts, will now be more particularly described with reference to the accompanying drawings and pointed out in the claims. It will be understood that the particular zone-melt recrystallization method and apparatus embodying the invention is shown by way of illustration only and not as a limitation of the invention.

The principal features of this invention may be employed in various embodiments without departing from the scope of the invention.

DETAILED DESCRIPTION OF THE INVENTION

Figure 1:
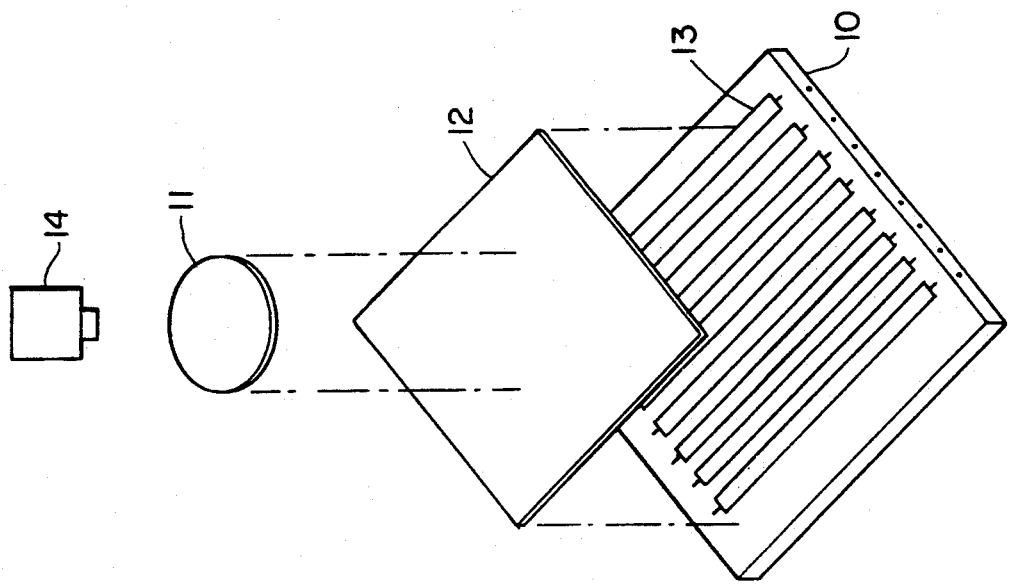
FIG. 1 is a perspective view of the zone melt recrystallization apparatus of the present invention.

A preferred embodiment of the invention is illustrated in the perspective view of FIG. 1. In operation, the entire block 10 would be raised to the temperature for ZMR operation just below the melting point of a semiconductor material 11. Then individual elements 13 are heated to a temperature required to melt the semiconductor 11. To create a hot zone 80 mils in width for example requires four heating elements with a 25/1000 inch spacing between each element. These individual heating elements can be provided with enough additional current above their bias current to melt the silicon material. To move the hot zone, the power would be provided to an adjacent heating element, to one side of the four presently being heated, while the element on the opposite side of the four hot elements would be provided only its bias current. In this way, the hot zone would be shifted over by one heating element. This process could be continued at any desired rate to move the zone across the wafer.

In a preferred embodiment, it is possible to provide varying degrees of current to individual wires. This permits gradual heating at the edge of the moving zone.

Through proper control, the heating elements could be heated in a more analog or continuous way in order to produce a much smoother transition as the heating zone is translated.

Through proper design, this heater concept provides a way of significantly reducing the mechanical strains in the ZMR processing system. The moving zone could be made to move more uniformly and more smoothly than any mechanical system and at a significant reduction in overall system complexity and cost. In the configuration of FIG. 1, a silicon wafer 11 is placed top side down on the plate 12 which is in thermal contact with elements 13.

Instead of picking up a wafer with pins as is done in current systems, it would be much more desirable to use a vacuum in this system.

A further advantage is that in order to view the molten zone in the present system, we use a video camera which must be placed at exactly the right angle with respect to the upper heater, which limits the field of view as it permits viewing of only a fraction of the molten zone. With the new system, the camera 14, which is sensitive to infrared light, would view the entire melt zone through the backside of the wafer 11. The infrared image can be used to provide a feedback signal to the control circuit to insure that heating rates are within predetermined tolerance.

Figure 2:
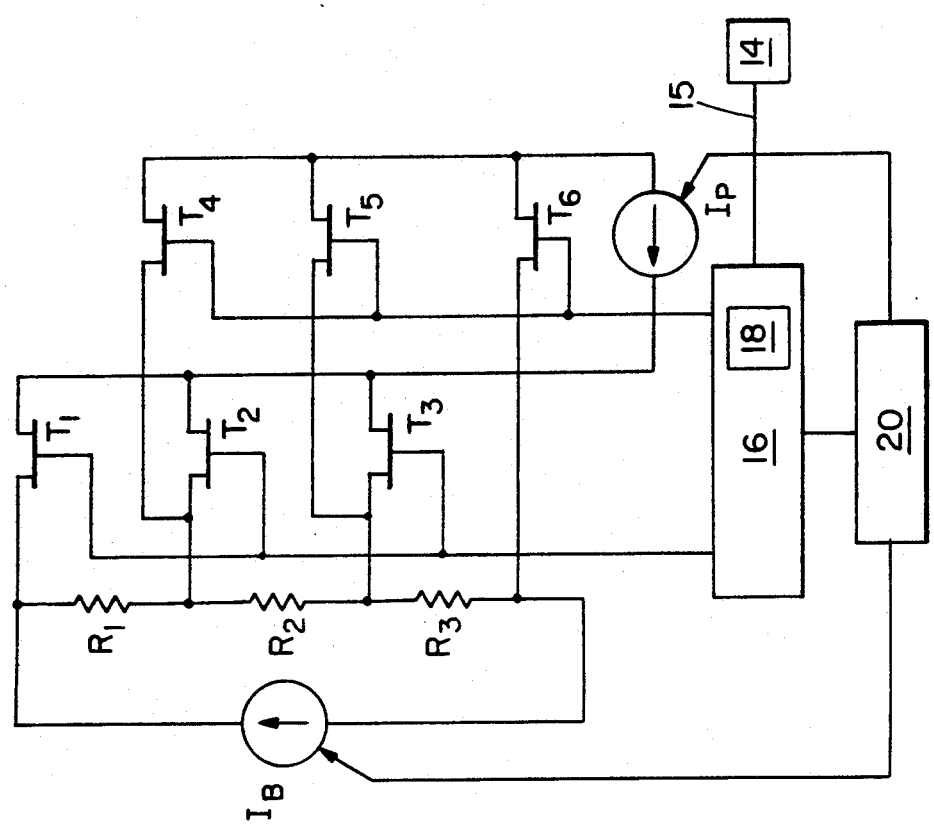
FIG. 2 is a schematic diagram of the control circuit for the apparatus of FIG. 1.

FIG. 2 shows a schematic diagram of the control elements of a preferred embodiment of the invention. The resistors $R_1$, $R_2$, and $R_3$ represent individual heating elements. There are about 300 of these elements in the present embodiment. Only three are shown for purposes of illustration. A first DC current source $I_B$ provides power to bring the heater close to the melting temperature of the wafer. A second DC current source $I_P$ supplies power to bring each heater element to the melting temperature of the wafer when commanded by computer. Each element has a pair of transistors, one to connect the positive side of the $I_P$ source, and the second to connect the negative terminal of the $I_P$ source, to the desired element or elements. This allows both icnreasing and decreasing the current of the selected elements around the $I_B$ value.

The computer tells the multiplexer which elements will be effected by the Ip source. The computer also establishes the set points for the controlled elements which in combination with the video camera provide the control of the pulse width modulator.

Another preferred embodiment utilizes a heater element wherein the elements are portions of a single wire wound about the block such that each portion is controlled by the circuit as shown in FIG. 2.

Yet another embodiment uses carbon or graphite elements deposited on the plate, which may be made from alumina, zirconia, or some other refractory material. These elements can be formed into a sequence of parallel lines, each individually controlled. The elements can also be configured in a dot matrix type configuration.

We claim:

1. A heating system for zone melt recrystallization of a semiconductor material comprising:
    a heater to heat a stationary wafer of semiconductor material positioned in a plane over the heater to a temperature slightly below the melting point of said material, the heater being positioned completely underneath the plane of the semiconductor material and comprising a stationary plurality of independently heatable elements such that each element can be heated above the melting point of the material thereby melting a portion of the material to generate a melted zone;
    a thermally conductive member positioned between, and thermally coupled with, the underlying heatable elements and the semiconductor material being recrystallized such that the member supports the material; and
    a controller for controlling the temperature of each heating element such that the melted zone of the material is translated across the material to melt and solidify said material to achieve lateral epitaxial growth.

2. The heating system of claim 1 wherein said semiconductor material is comprised of amorphous or polycrystalline silicon.

3. The heating system of claim 1 wherein said silicon has an insulating layer formed thereon.

4. The heating system of claim 1 wherein said plurality of heating elements are each comprised of resistive wire.

5. The heating system of claim 1 wherein said member is comprised of a refractory material.

6. The heating system of claim 5 wherein said refractory material is comprised of alumina.

7. The heating system of claim 1 wherein said control means comprises:
    a computer for ordering a sequence through which each element is heated to melt a portion of the semiconductor;
    a multiplexer for adjusting a current through each element; and
    a feedback system comprising a sensor for measuring the temperature of each element, a comparator for comparing the measured temperature to a reference temperature, and means for generating an electrical siganl for adjusting the temperature of each element.

8. The heating system of claim 7 wherein said sensor is comprised of a video camera.

9. A method of recrystallizing a semiconductor material comprising;
    positioning a semiconductor material to be recrystallized on a heat conductive member in thermal contact with a heater underlying the conductive member;
    heating a plurality of heater elements of said heater to a first temperature so as to heat the semiconductor material to a temperature below a melting temperature of the semiconductor material;
    further heating at least a first heating element to a second temperature above the melting temperature of the semiconductor material to melt a portion of the material positioned above said element to form a melted zone in the material;
    heating additional elements adjacent said first element to a temperature above the melting temperature of the material to melt a further portion of material positioned above the additional elements and cooling the first element such that the melted zone is continuously translated from above the first element to above the additional elements; and
    iterating the further heating and subsequent cooling of adjacent heating elements to translate the melted zone across the material such that lateral epitaxial growth is achieved.

10. The method of recrystallizing a semiconductor material as defined in claim 9 wherein a plurality of adjacent elements are simultaneously heated to form the melted zone during translation of the zone across the material.

11. The method of recrystallizing a semiconductor material of claim 9 wherein said elements are comprised of wire.

12. The method of claim 9 further comprising sensing the translating melted zone of the material with a sensor during the heating and cooling of the semiconductor material.

13. The method of claim 12 further comprising generating a control signal with the sensor and modifying the temperature of one or more heating elements to control the temperature of the semiconductor material.

14. An apparatus for crystallizing a semiconductor material comprising:
    a heat source positioned under a stationary wafer of semiconductor material to be zone melt crystallized, the heat source comprising a plurality of stationary heating elements that are heated to maintain an elevated temperature of the semiconductor material below a melting point of the material such that selected elements can be further heated to melt a portion of the material overlying the selected elements;
    a sensor positioned above the wafer to be crystallized to monitor a melted zone of the semiconductor material; and
    a control circuit to control the temperature of each heating element such that the melted zone of material is translated across the material to melt and solidify the material to achieve lateral epitaxial growth, the control circuit being responsive to a signal generated by the sensor to compare a sensed characteristic of the melted zone with a predetermined value and modify the heat generated by one or more elements to control the temperature of the material during crystallization.

15. The apparatus of claim 14 wherein the sensor comprises a light sensor to receive radiation being emitted by the semiconductor material.

16. The apparatus of claim 14 wherein the control circuit comprises a multiplexer to adjust the current through each element.

17. The apparatus of claim 14 further comprising a thermal conductor positioned between the material and the heat source.

18. A method of crystallizing a semiconductor material comprising:

positioning a semiconductor material to be recrystallized in a plane on a heat conductive member that is thermally coupled with a heater underlying the plane and the conductive member;

heating a plurality of heater elements of said heater to a first temperature so as to heat the semiconductor material to a temperature below a melting temperature of the semiconductor material;

further heating at least a first heating element to a second temperature above the melting temperature of the semiconductor material to melt a portion of the material positioned above said element to form a melted zone in the material;

heating additional elements adjacent said first element to a temperature above the melting temperature of the material to melt a further portion of material positioned above the additional elements and cooling the first element such that the melted zone is continuously translated from above the first element to above the additional elements;

sensing the translating melted zone with a sensor positioned above the plane in which the semiconductor material is positioned;

controlling the temperature of the heating elements in response to a signal generated by the sensor; and iterating the further heating and subsequent cooling of adjacent heating elements to translate the melted zone across the material such that lateral epitaxial growth is achieved.

19. The method of claim 18 further comprising programming a computer to control the temperature of each heating element during recrystallization.

* * * * *